United States Patent
Ito et al.

(10) Patent No.: US 11,678,453 B2
(45) Date of Patent: Jun. 13, 2023

(54) CONNECTOR, IC PACKAGE, AND METHOD OF MOUNTING CONTACTS TO HOUSING OF CONNECTOR

(71) Applicants: YAMAICHI ELECTRONICS CO., LTD., Tokyo (JP); HUAWEI TECHNOLOGIES CO., LTD., Guangdong (CN)

(72) Inventors: Toshiyasu Ito, Tokyo (JP); Hui Zhang, Guangdong (CN); Jie Zhang, Guangdong (CN); Xiaohui Li, Guangdong (CN)

(73) Assignees: YAMAICHI ELECTRONICS CO., LTD., Tokyo (JP); HUAWEI TECHNOLOGIES CO., LTD., Guangdong (CN)

( * ) Notice: Subject to any disclaimer, the term of this patent is extended or adjusted under 35 U.S.C. 154(b) by 0 days.

(21) Appl. No.: 17/333,744

(22) Filed: May 28, 2021

(65) Prior Publication Data

US 2021/0378121 A1   Dec. 2, 2021

(30) Foreign Application Priority Data

Jun. 2, 2020   (CN) .......................... 202010489941.1

(51) Int. Cl.
*H01R 13/62*   (2006.01)
*H05K 7/10*   (2006.01)
(Continued)

(52) U.S. Cl.
CPC ......... *H05K 7/1053* (2013.01); *H01R 12/716* (2013.01); *H01R 33/76* (2013.01); *H01R 43/16* (2013.01)

(58) Field of Classification Search
CPC .. H05K 7/1053; H05K 7/1061; H01R 12/716; H01R 33/76; H01R 43/16;
(Continued)

(56) References Cited

U.S. PATENT DOCUMENTS 5,305,188 A * 4/1994 Kubo ................... H05K 7/1053
361/752
5,443,404 A * 8/1995 Matsuoka ............ H05K 7/1023
439/70

(Continued)

FOREIGN PATENT DOCUMENTS

JP   2012174616 A   9/2012

*Primary Examiner* — Abdullah A Riyami
*Assistant Examiner* — Nelson R. Burgos-Guntin
(74) *Attorney, Agent, or Firm* — Hayes Soloway PC

(57) ABSTRACT

A socket which holds an IC package and is to be mounted on a circuit board is described that includes: a housing with a bottom portion, two pairs of side wall portions and an opening accommodating the IC package, contacts and holders. The bottom portion is provided with penetration holes. The two pairs of side wall portions face each other across the opening and one pair of side wall portions are provided with ribs protruding outward. The contacts are supported by the housing so as to pass through the penetration holes and are exposed on an opposite side of the opening. The holders have first support holes and are fixed to side surfaces of the housing with the ribs passing through the first support holes.

9 Claims, 23 Drawing Sheets

(51) Int. Cl.
  *H01R 43/16* (2006.01)
  *H01R 12/71* (2011.01)
  *H01R 33/76* (2006.01)

(58) Field of Classification Search
  CPC .............. H01R 12/57; H01R 13/2442; H01R 13/6471; H01R 12/7076; H01R 13/73; H01R 12/707; H01R 13/02; H01R 33/74; H01R 43/20
  See application file for complete search history.

(56) References Cited

U.S. PATENT DOCUMENTS

| | | | | |
|---|---|---|---|---|
| 6,276,949 | B1* | 8/2001 | Nakano | G01R 1/0483 439/330 |
| 7,815,456 | B2* | 10/2010 | Kunioka | H01R 13/2421 439/73 |
| 7,887,355 | B2* | 2/2011 | Watanabe | H05K 7/1061 439/73 |
| 2002/0197891 | A1* | 12/2002 | Suematsu | G01R 1/0466 439/71 |
| 2004/0058580 | A1* | 3/2004 | Shirai | H01R 12/714 439/342 |
| 2006/0035539 | A1* | 2/2006 | Shirai | H01R 13/2442 439/862 |
| 2007/0238327 | A1* | 10/2007 | Hsu | G01R 31/2863 439/70 |
| 2008/0188110 | A1* | 8/2008 | Kobayashi | H05K 7/1061 439/296 |
| 2009/0246983 | A1* | 10/2009 | Toda | G01R 1/0466 439/69 |
| 2009/0311902 | A1* | 12/2009 | Liao | H05K 7/1053 439/331 |
| 2010/0159731 | A1* | 6/2010 | Kunioka | H01R 13/2492 439/73 |
| 2011/0201221 | A1* | 8/2011 | Kobayashi | H05K 7/1061 439/331 |
| 2018/0238957 | A1* | 8/2018 | Nakamura | H01R 33/76 |
| 2019/0302144 | A1* | 10/2019 | Nakamura | H01R 13/2421 |
| 2020/0251867 | A1* | 8/2020 | Tsuneoka | H05K 7/1084 |
| 2021/0075169 | A1* | 3/2021 | Toyama | G01R 31/2863 |
| 2021/0148970 | A1* | 5/2021 | Miyaaki | G01R 1/0466 |
| 2021/0184383 | A1* | 6/2021 | Ito | H01R 13/187 |
| 2021/0257765 | A1* | 8/2021 | Yamada | H01R 13/03 |
| 2021/0341533 | A1* | 11/2021 | Kobayashi | G01R 31/2863 |
| 2021/0376530 | A1* | 12/2021 | Ito | H01R 12/70 |
| 2021/0378121 | A1* | 12/2021 | Ito | H05K 7/1053 |
| 2022/0209445 | A1* | 6/2022 | Ito | H01R 12/707 |

* cited by examiner

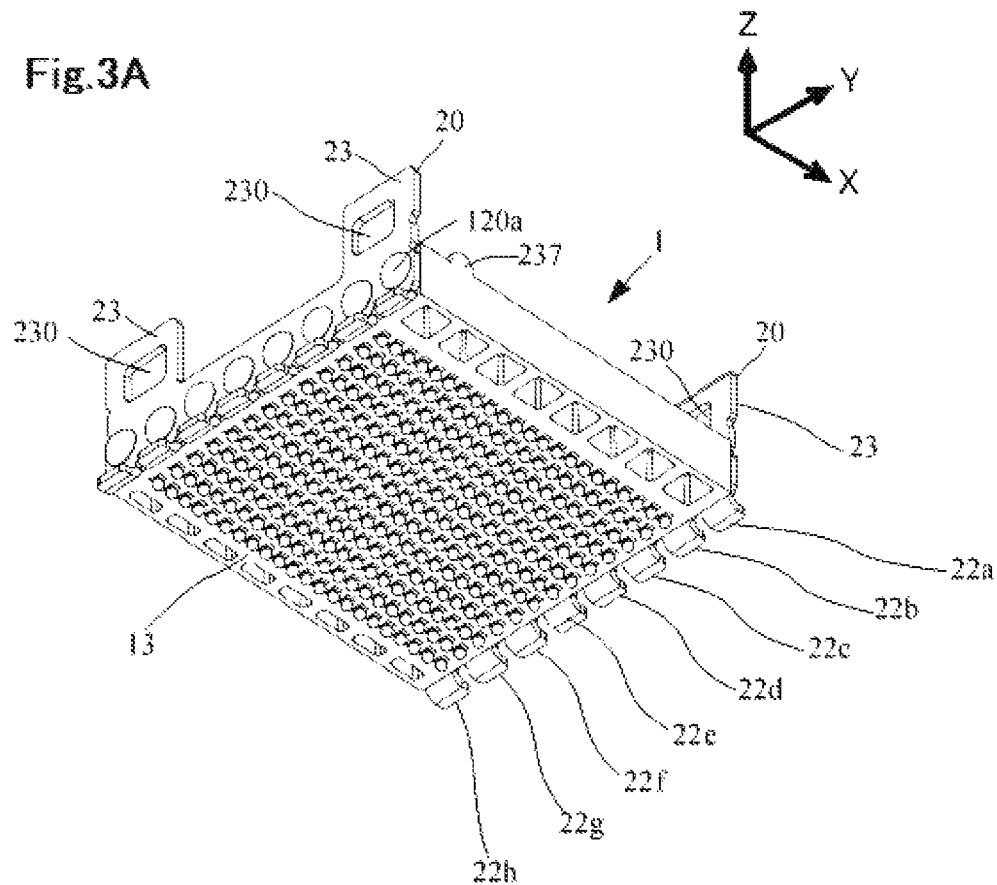
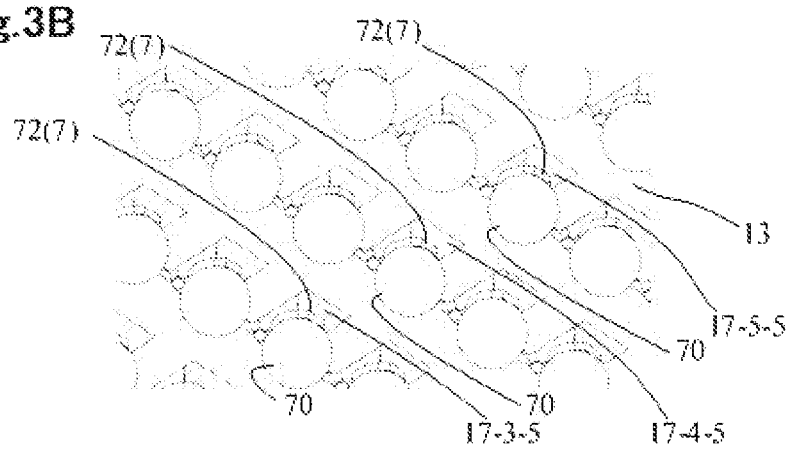

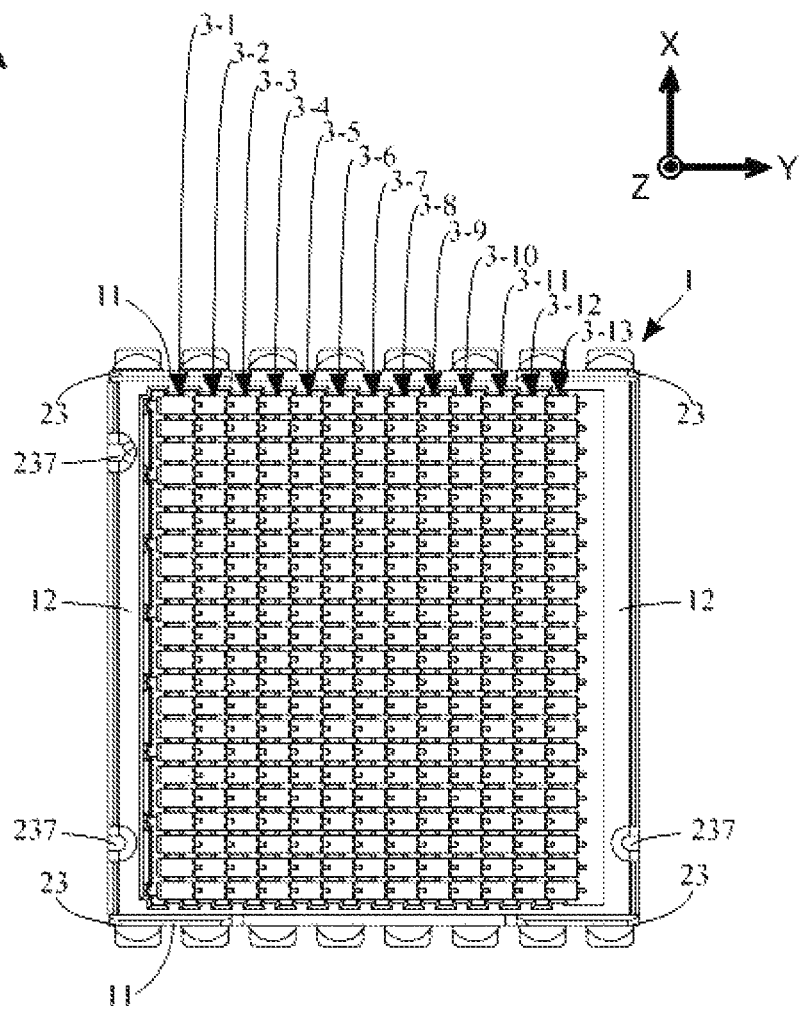

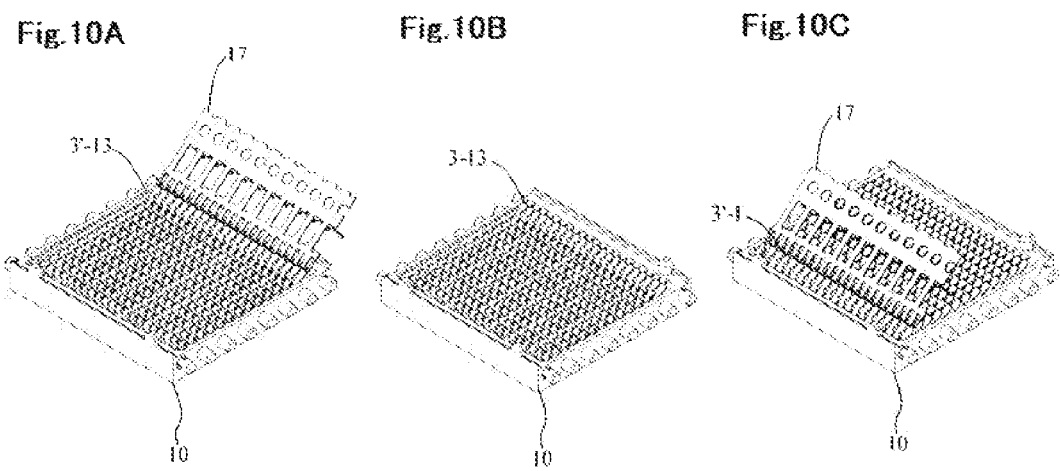

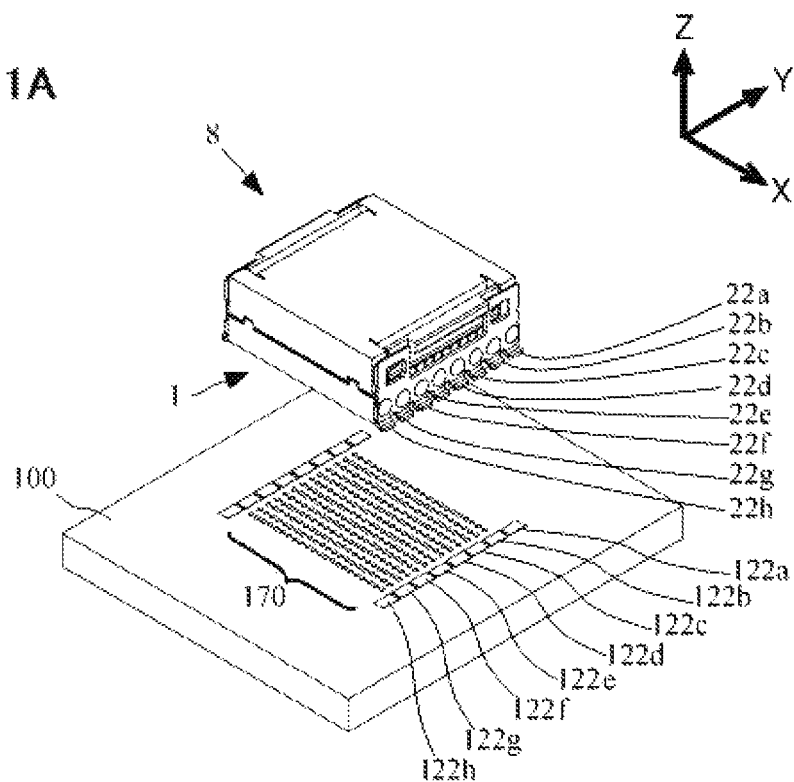

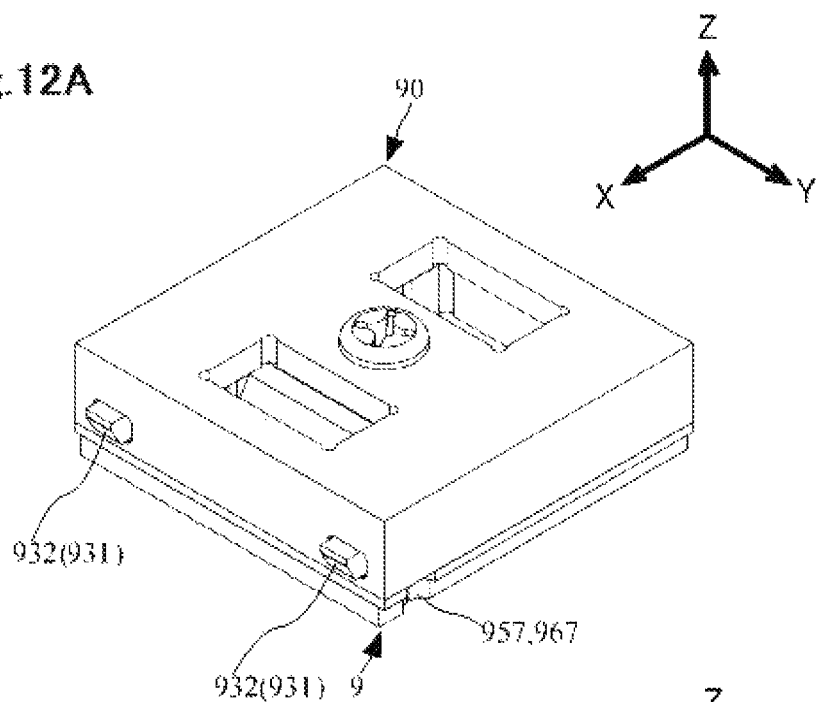
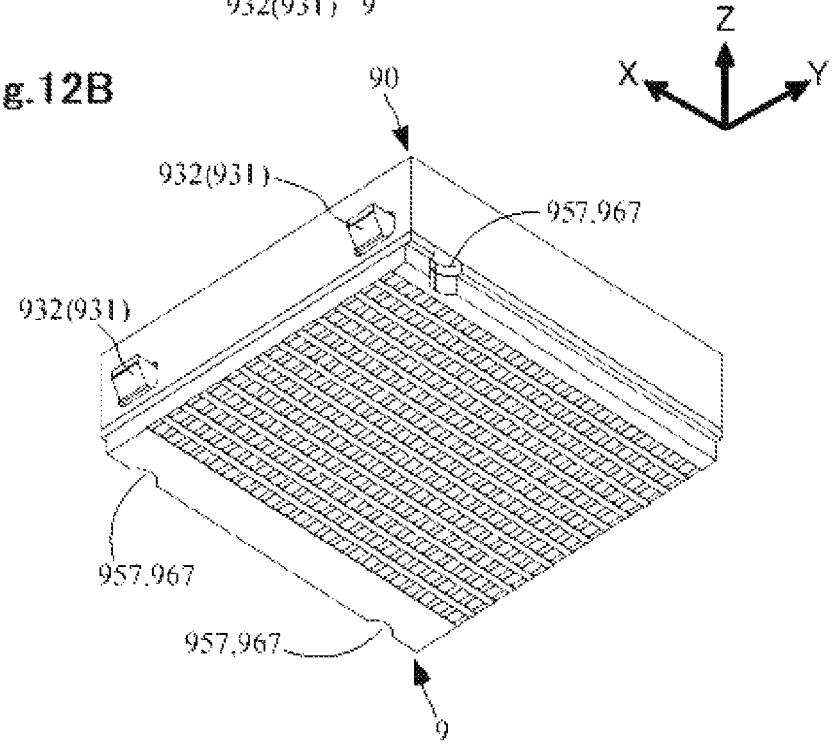

CONNECTOR, IC PACKAGE, AND METHOD OF MOUNTING CONTACTS TO HOUSING OF CONNECTOR

CROSS-REFERENCE TO RELATED APPLICATION

This application claims the benefit of Chinese Patent application CN202010489941.1 filed on Jun. 2, 2020, the contents of which are incorporated herein by reference herein.

TECHNICAL FIELD

The present disclosure relates to a connector for high-speed transmission to be mounted on a circuit board.

BACKGROUND

Some LGA (Land grid array) packages are mounted on circuit boards via specialized sockets rather than directly mounted on the circuit boards. As an example of documents disclosing a technique related to this type of socket of LGA package, Japanese Patent Application Publication No. 2012-174616 (hereinafter, referred to as "Patent Document 1). In the socket for electronic component disclosed in Patent Document 1, a metal board with a plurality of penetration holes is used as the bottom of the housing, contacts for signal and contacts for ground arranged in a lattice shape are inserted into the penetration holes of the metal board, and the contacts are fixed to the housing. The contact of this socket for an electronic component includes a terminal base portion extending in a straight line, a first connecting portion bent in an L-shape at the lower end of the terminal base portion, an arm portion bent in a substantially S-shape at the upper end of the terminal base portion, and a second connecting portion extending in a same direction as the bending direction of the first connecting portion from the upper end of the arm portion. The first connection portion of the contact of this socket for electronic component is exposed on the lower side of the bottom surface of the housing. In a reflow process, the connecting portion of the socket for the electronic component is soldered to the land of the circuit board and mounted on the circuit board.

However, in the case of the technique of Patent Document 1, there is a problem that when the solder is melt by reflow, the solder moves up and down and sinks, the positioning accuracy of the contact on the circuit board is deteriorated.

The present disclosure has been made in view of such a problem, and one of the objects is to provide a contact which can be accurately mounted to a target portion on the circuit board.

SUMMARY

In accordance with a first aspect of the present disclosure, there is provided a socket which holds an IC package and is to be mounted on a circuit board. The socket includes: a housing with a bottom portion, two pairs of side wall portions and an opening accommodating an IC package, a plurality of contacts and holders. The bottom portion is a bottom of the opening and is provided with a plurality of penetration holes. The two pairs of side wall portions face each other across the opening and one pair of side wall portions are provided with a plurality of ribs protruding outward. The plurality of contacts are supported by the housing so as to pass through the plurality of penetration holes and are exposed on an opposite side of the opening. The holders have a plurality of first support holes and are fixed to side surfaces of the housing with the ribs passing through the first support holes. At least a portion of a lower end of the holder extends downward below a lower end of the housing and is bent outward, and this bent portion forms a mounting surface to be soldered to the board.

In accordance with a second aspect of the present disclosure, there is provided an IC package including a printed board, a casing in a box shape, protruding pieces and elastic members. The casing has two side boards and holds the printed board. The protruding pieces are supported movably forward and backward by the two side boards of the casing. The elastic members apply outward urging force to the protruding pieces. When the IC package is fitted and pressed down between two holders of a connector from an opening of the connector, the protruding pieces are pushed by the holders and evacuate inward, and when the IC package is further pressed down, the protruding pieces are fitted to support holes of the holders, and the IC package is supported by the holders.

In accordance with a third aspect of the present disclosure, there is provided a method of mounting contacts to a housing of a connector including performing for all columns of the penetration holes following steps of: pressing a plurality of contacts fixed to an anchor into a column of penetration holes of a connector. The plurality of contacts each includes a linear portion extending in a straight line and being provided with a notch in the middle, and a connecting portion bent in an L-shape at an lower end of the linear portion; folding and removing the anchor of the plurality of contacts pressed into the column of penetration holes; and bending portions above the notches of the plurality of contacts from which the anchor has been removed using the notches as ridgelines.

BRIEF DESCRIPTION OF THE DRAWINGS

FIG. 3A is a perspective view of the socket of FIG. 1 as viewed from another angle;

FIG. 3B is an enlarged view of a portion of FIG. 3A;

FIG. 4A is a diagram of the socket of FIG. 1 as viewed from a +Z side;

FIG. 4B is a diagram showing an arrangement of contacts in FIG. 4A;

FIGS. 10A, 10B and 10C illustrate a diagram showing procedures of mounting the assembly bodies 3-*j* (j=1 to 13) to the housing of the socket of FIG. 1;

FIGS. 11A and 11B illustrate a diagram showing an appearance of mounting the socket of FIG. 1 to a circuit board;

FIG. 12A is a perspective view of an IC package according to an embodiment of the present disclosure;

FIG. 12B is a perspective view of the IC package of FIG. 12A as viewed from another angle;

DETAILED DESCRIPTION

Figure 1:
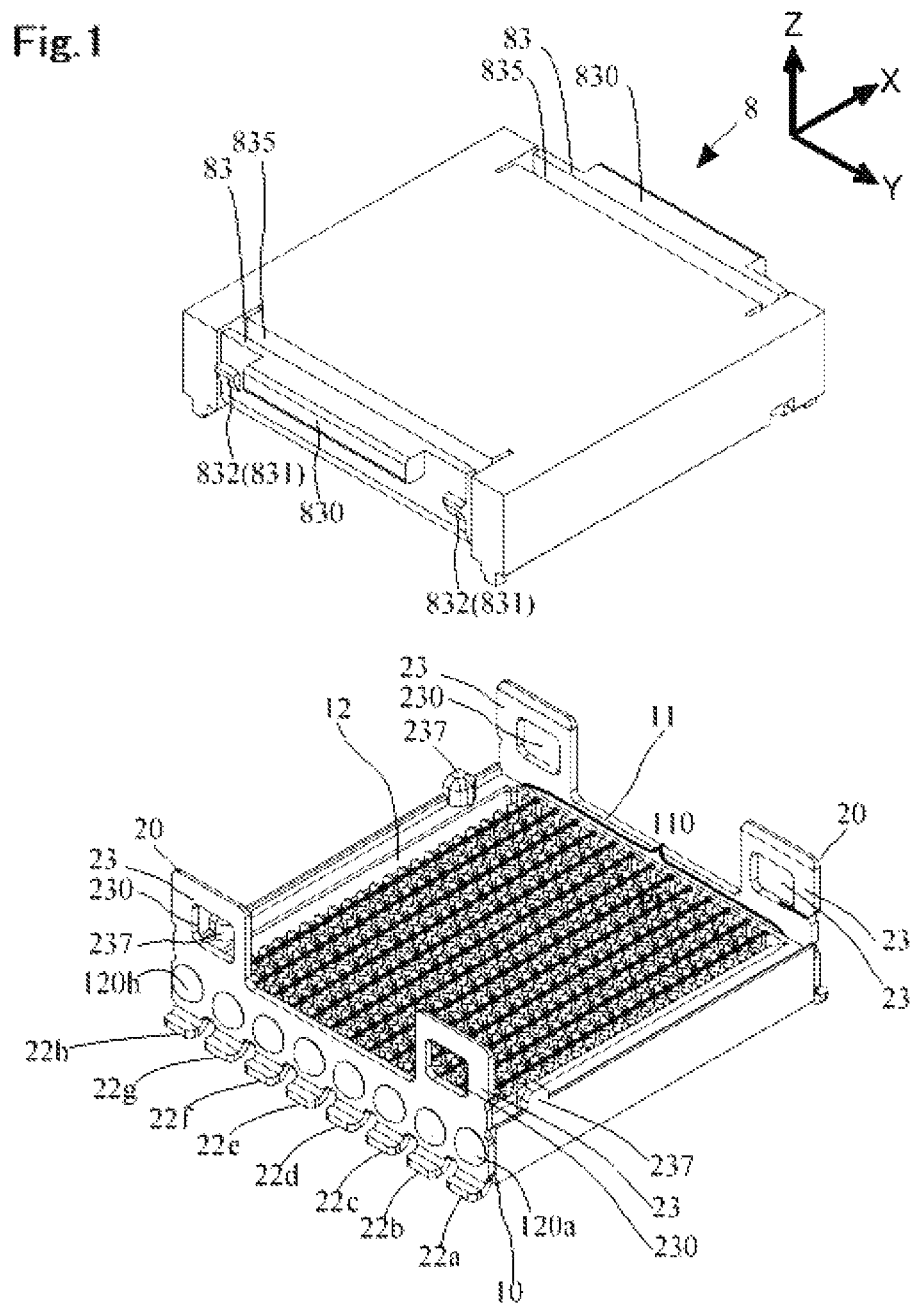
FIG. 1 is a perspective view of a socket and a cap, according to an embodiment of the present disclosure.
Figure 2:
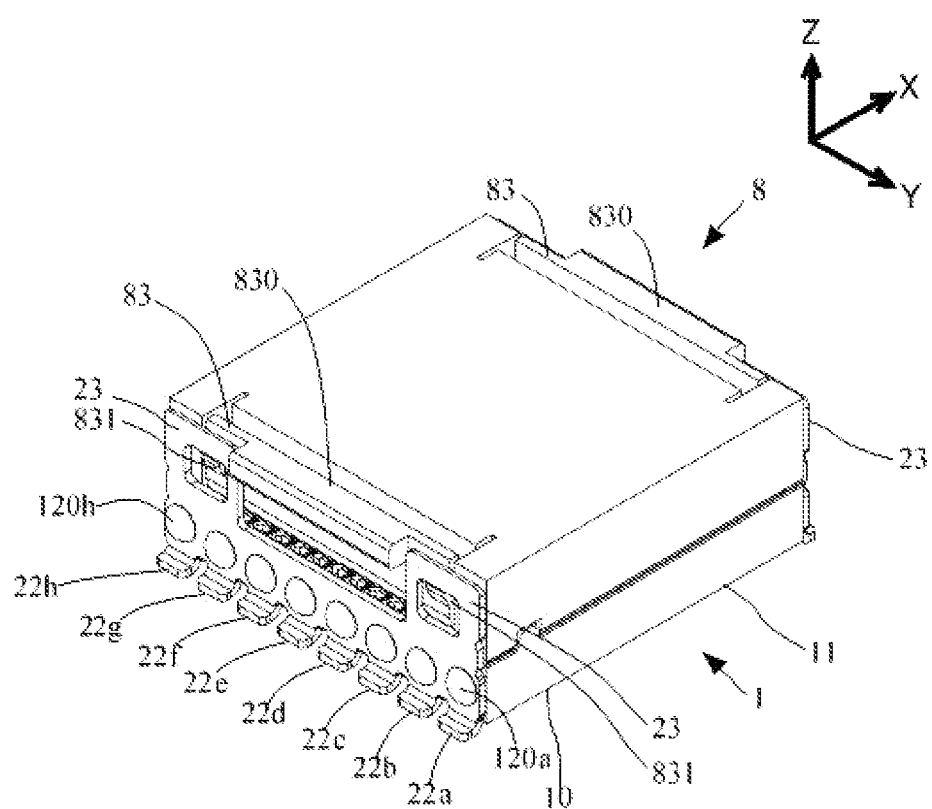
FIG. 2 is a diagram showing a state in which the cap is mounted on the socket of FIG. 1.

Hereinafter, a socket 1 according to one embodiment of the present disclosure is explained with reference to drawings. The socket 1 is mounted on a circuit board 100, and is used by fitting the IC package 9 to the opening 110 on the opposite side of the mounting surface. The IC package 9 is an optical transceiver. The IC package 9 performs a high-speed differential transmission of up to 112 Gbbs by PAM (Pulse Amplitude Modulation) 4.

In the following description, the fitting direction of the IC package 9 to the socket 1 is appropriately referred to as the Z-direction, the direction orthogonal to the Z direction is appropriately referred to as the X direction and the direction orthogonal to both the Z direction and the X direction is appropriately referred to as the Y direction. Further, the open side of the opening 110 of the socket 1 in the Z-direction is referred to as the upper side, and the reverse side is referred to as the lower side.

As shown in FIG. 1, FIG. 3A, FIG. 4A, FIG. 7A, FIG. 7B, FIG. 7C, and FIG. 8, the socket 1 has a housing 10, holders 20, contacts 7, insulating members 40, 50, conductive resin members 60, and insulating supplemental members 69. The housing 10 is formed in a box shape with an opening 110. The housing 10 has a bottom portion 13 forming the bottom of the opening 110, and two pairs of side wall portions 11 and 12 facing each other in the X-direction and the Y-direction with the opening 110 sandwiched therebetween. The insulating members 40, 50, and the insulating supplemental members 69 are members made of LCP (Liquid Crystal Polymer). The conductive resin members 60 are members made of conductive resin with a conductivity range of 20 S/m to 200 S/m.

Figure 5:
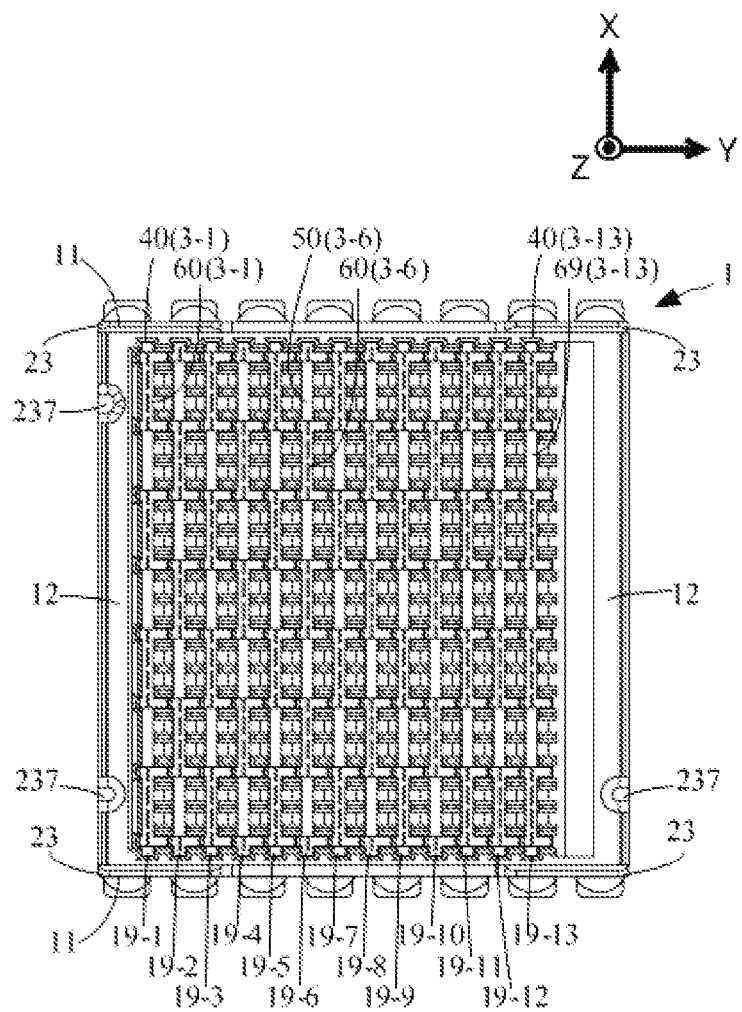
FIG. 5 is a diagram in which the contacts have been removed from FIG. 4A.
Figure 9:
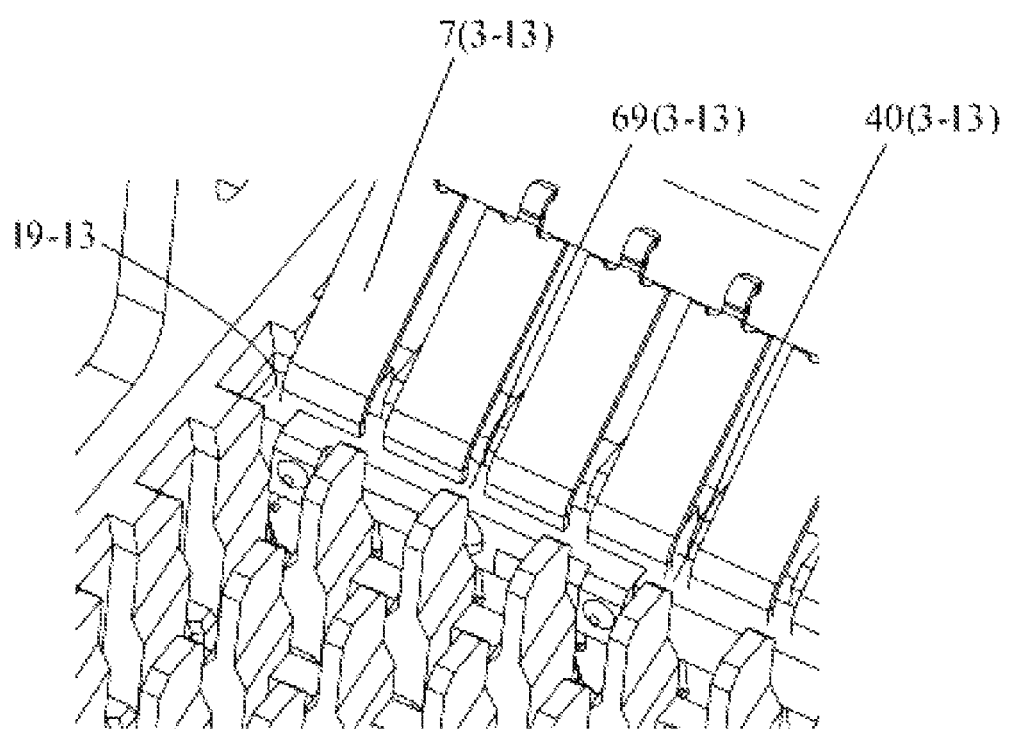
FIG. 9 is an enlarged view of a portion of the socket of FIG. 1.

The bottom portion 13 are provided with a matrix of 22 rows and 13 columns of penetration holes 17-*i* (i=1 to 22)-*j* (j=1 to 13). As shown in FIG. 5 and FIG. 9, grooves 19-*j* (j=1 to 13) are provided on both sides of the row direction of the matrix of penetration holes 17-*i* (i=1 to 22)-*j* (j=1 to 13) in the inner surface of the side wall portions 11 facing each other in the X-direction.

The side surface of each of the two side wall portions 11 facing each other in the X-direction is provided with eight ribs 120a, 120b, 120c, 120d, 120e, 120f, 120g, and 120h. The cross sections of the ribs 120a, 120b, 120c, 120d, 120e, 120f, 120g, and 120h have a perfect circular shape. The eight ribs 120a, 120b, 120c, 120d, 120e, 120f, 120g, 120h of the side wall portions 11 on the ±X-sides are passed through eight support holes of the holders 20 on the ±X-sides and are fused in the eight support holes.

The portions directly below the eight support holes at the lower ends of the holders 20 extend downward as protruding portions 22a, 22b, 22c, 22d, 22e, 22f, 22g, 22h. The protruding portions 22a, 22b, 22c, 22d, 22e, 22f, 22g, and 22h of the holder 20 on the +X side are bent to the +X side, which is the outer side, on the lower side of the lower end of the housing 10. The protruding portion 22a, 22b, 22c, 22d, 22e, 22f, 22g, 22h of the holder 20 on the −X side is bent to the −X side, which is the outer side, on the lower side of the lower end of the housing 10. The lower surfaces of these bent portions form mounting surfaces to be soldered to the circuit board 100.

Portions apart from each other on the +Y side and the −Y side at the upper end of the holder 20 extend upward above the upper end of the housing 10 as protruding portions 23. The protruding portions 23 are provided with rectangular support holes 230. Protruding pieces 831 of the cap 88 and protruding pieces 931 of the IC package 9 are fitted to the support holes 230. More details will be described below.

As shown in FIG. 1B, FIG. 4A, and FIG. 5, two positioning pins 237 are provided at the side wall portion 12 of the housing 10 on the −Y-side, and one positioning pin 237 is provided at the side wall portion 12 on the +Y-side. The positioning pins 237 are fitted to the positioning groove of the cap 8 and the positioning grooves 957, 967 of the IC package 9. More details will be described below.

Figure 6A:
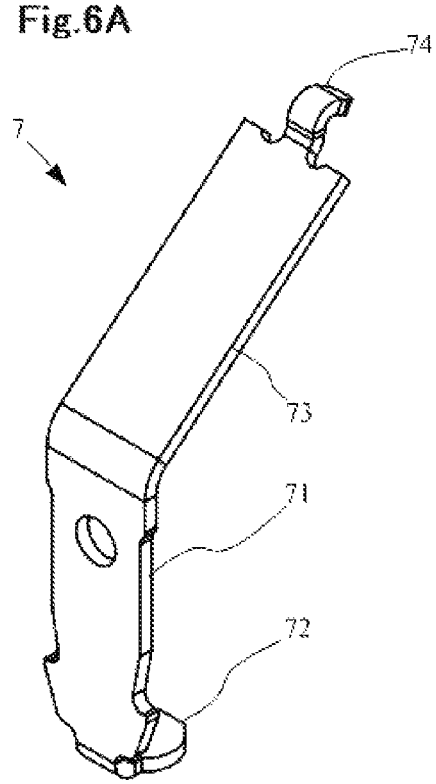
FIG. 6A is a perspective view of the contact of the socket of FIG. 1.

As shown in FIG. 6A, the contact 7 includes: a base portion 71 extending in a straight line in the Z-direction; a solder connecting portion 72 bent in an L-shape to the +Y-side at the lower end of the base portion 71; an inclined portion 73 bent at an obtuse angle and obliquely extending to the +Y-side with respect to the base portion 71 at the upper end of the base portion 71; and a contact portion 74 projecting from the upper end of the inclined portion 73.

Here, the contacts 7 include contacts for −signal of high-speed differential transmission, contacts for +signal of high-speed differential transmission, contacts for ground, and contacts for low-speed signal transmission. In the following description, appropriately, letter (N) is attached to the contacts 7 for −signal of high-speed differential transmission, letter (P) is attached to the contacts 7 for +signal of high-speed differential transmission, letter (G) is attached to the contact 7 for ground 7, and letter (S) is attached to the contact 7 for low-speed signal.

The contacts 7 are arranged so as to form a matrix corresponding to the penetration holes 17-*i* (i=1 to 22)-*j* (j=1 to 13). The contacts 7 are line up at intervals of 0.65 millimeters. Insulating members 40 or 50, and conductive resin members 60 or insulating supplemental members 69 are formed by insertion molding in the contacts 7 which form each column.

The contacts 7 forming the first column, the third column, the fifth column, the seventh column, the ninth column, and the eleventh column, the insulating members 40, and the conductive resin members 60 are integrated to form assembly bodies 3-1, 3-3, 3-5, 3-7, 3-9, and 3-11 of the first column, the third column, the fifth column, the seventh column, the ninth column, and the eleventh column. The contacts 7 forming the second column, the fourth column, the sixth column, the eighth column, and the tenth column, the insulating members 50, and the conductive resin members 60 are integrated to form assembly bodies 3-2, 3-4, 3-6, 3-8, and 3-10 of the second column, the fourth column, the sixth column, the eighth column, and the tenth column. The contacts 7 forming the twelfth column and the thirteenth column, the insulating members 40, and the insulating supplemental members 69 are integrated to form assembly bodies 3-13 and 3-14 of the thirteenth twelfth column and the fourteenth thirteenth column.

Then, the insulating members 40, 50 of the assembly bodies are pressed in the grooves 19-*j* (j=1 to 13) of the housing 10 so that the solder connecting portions 72 of the contacts 7 are exposed on the opposite side of the opening 110 from the penetration holes 17-*i* (i=1 to 22)-*j* (j=1 to 13) of the housing 10.

More specifically, as shown in FIG. 4B, the respective pairs of the contacts 7 (N) and the contacts 7 (P) in the first column to the seventh column are arranged apart from each other in the row direction and the column direction. The contacts 7 (G) are arranged at adjacent positions in the column direction and adjacent positions in the row direction in each of the respective pairs of the contacts 7(N) and the contact 7(P), thereby surrounding the pairs.

Figure 7A:
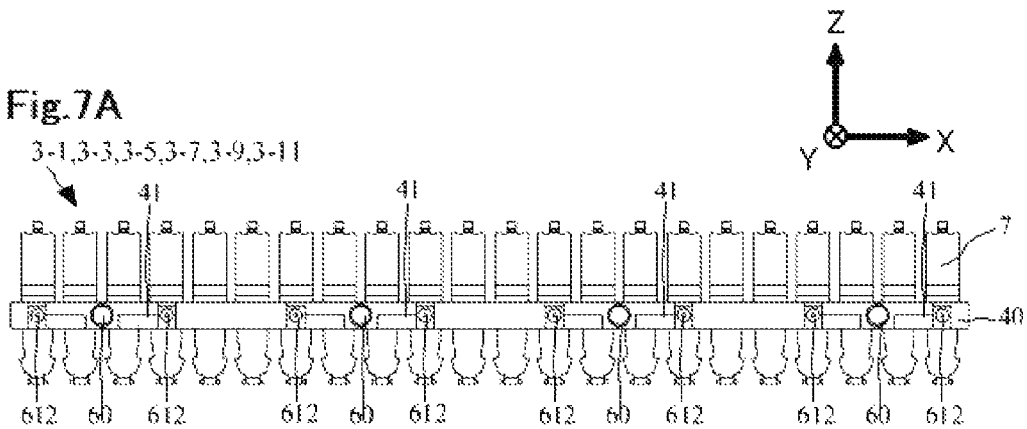
FIG. 7A is a diagram of assembly bodies 3-1, 3-3, 3-5, 3-7, 3-9, and 3-11 of a first column, a third column, a fifth column, a seventh column, a ninth column, and an eleventh column in the socket of FIG. 1 as viewed from a −Y direction.
Figure 7B:
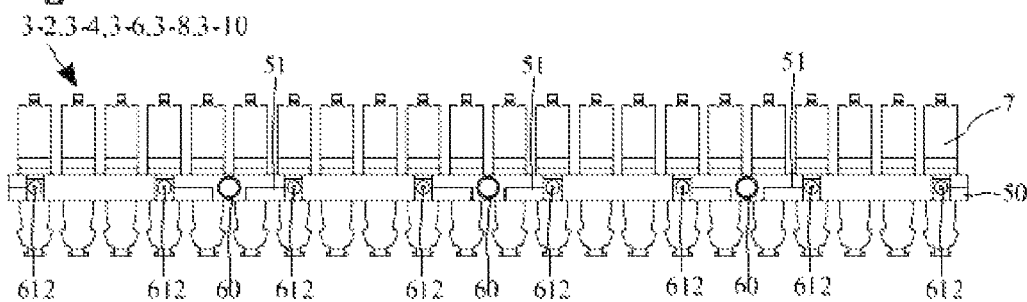
FIG. 7B is a diagram of assembly bodies 3-2, 3-4, 3-6, 3-8, and 3-10, of a second column, a fourth column, a sixth column, an eighth column and a tenth column as viewed from the −Y direction.
Figure 7C:
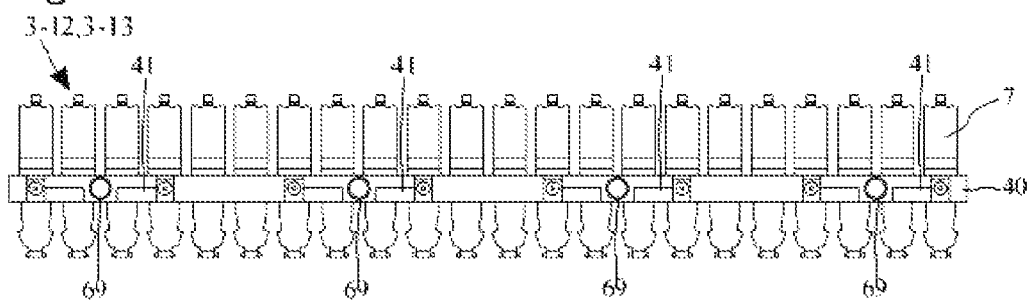
FIG. 7C is a diagram of assembly bodies 3-12 and 3-13 of the twelfth column and a thirteenth column as viewed from the −Y direction.

As shown in FIG. 7A and FIG. 7C, the insulating members 40 of the assembly bodies 3-1, 3-3, 3-5, 3-7, 3-9, 3-11, 3-12, and 3-13 of the first column, the third column, the fifth column, the seventh column, the ninth column, the eleventh column, the twelfth column, and the thirteenth column are in a rod shape extending in the X direction. In the insulating members 40, positions corresponding to the first row to the fourth row, positions corresponding to the seventh row to the tenth row, and positions corresponding to the thirteenth row to the sixteenth row are concaved downward as concave portions 41.

As shown in FIG. 7B, the insulating members 50 of the assembly bodies 3-2, 3-4, 3-6, 3-8, and 3-10 of the second column, the fourth column, the sixth column, the eighth column, and the tenth column are in a rectangular parallelepiped shape with a width in the X direction that is the same as the dimension of the insulating members 40. In the insulating members 50, positions corresponding to the first row, positions corresponding to the fourth row to the seventh row, positions corresponding to the tenth row to the thirteenth row, and positions corresponding to the sixteenth row are concaved downward as concave portions 51.

As shown in FIG. 7A and FIG. 7B, the conductive resin members 60 are fitted to the concave portions 41 of the insulating members 40 of the assembly bodies 3-1, 3-3, 3-5, 3-7, 3-9, and 3-11, and the concave portions 51 of the insulating members 50 of the assembly bodies 3-2, 3-4, 3-6, 3-8, and 3-10. As shown in FIG. 7C, the insulating supplemental members 69 are fitted to the concave portions 41 of the insulating members 40 of the assembly bodies 3-12 and 3-13. As shown in FIG. 5, the position of the conductive resin member 60 on the front side of the column direction, and the position of the conductive resin member 60 on the rear side of the column direction are offset in the row direction by three contacts.

Figure 8:
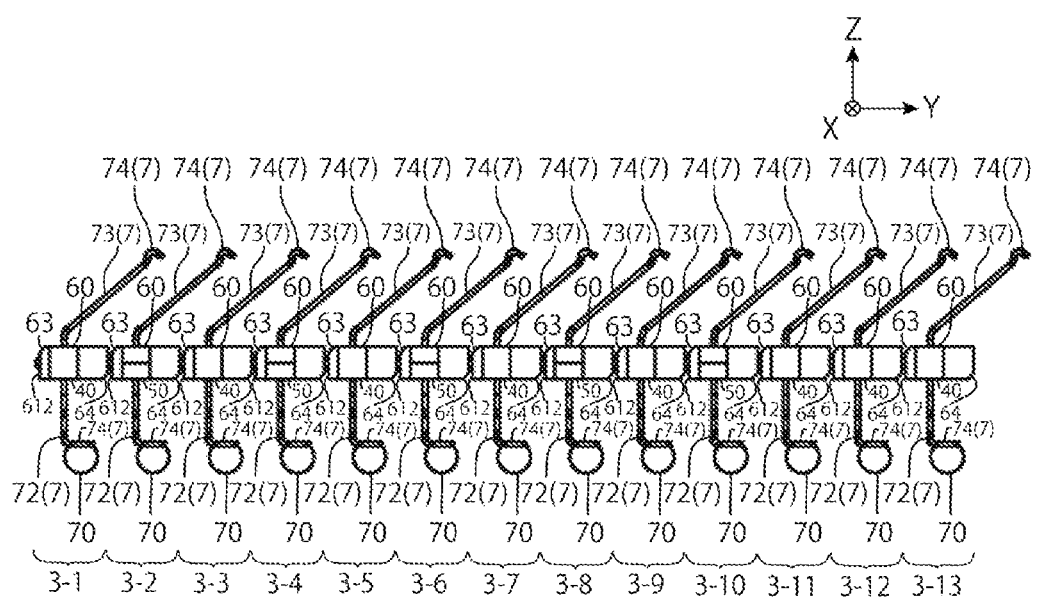
FIG. 8 is a diagram of a cut plane in parallel with an XZ-plane in the assembly bodies 3-*j* (j=1 to 13) of FIG. 4 as viewed from an −X direction.

As shown in FIG. 5 and FIG. 8, the conductive resin member 60 is in a substantially U-shape having a width in the X-direction that is the same as the concave portions 41 and 51 of the insulating members 40 and 50 and a width in the Y-direction larger than the insulating members 40 and 50. Convex portions 612 protruding to the −Y side are provided slightly inside both end portions of the front surface of the conductive resin member 60 in the Y direction.

The corner portion where the front surface and the upper surface of the conductive resin member 60 intersect, and the corner surface where the rear surface and the lower surface intersect are notched. Tapered surfaces 63 and 64 inclined substantially in parallel with the inclined portion 73 are provided on the side of the inclined portion 73 of the contact 7. The insulating supplemental member 69 has the same shape as the conductive resin member 60.

As shown in FIG. 7A, the base portions 71 of the contacts 7 (N) of the fifth row, the contact 7 (P) of the sixth row, the contacts 7 (N) of the eleventh row, the contacts 7 (P) of the twelfth row, the contacts 7 (N) of the seventeenth row, and the contacts 7 (P) of the eighteenth row of the assembly bodies 3-1, 3-3, 3-5, 3-7, 3-9, and 3-11 penetrate portions of the insulating members 40 to which the conductive resin members 60 are not fitted, and each base portion 71 is supported at the penetrated portion.

Further, the contacts 7 (G) of the first row to the fourth row, the seventh row to the tenth row, the thirteenth row to the sixteenth row, and the nineteenth row to the twenty-second row of the assembly bodies 3-1, 3-3, 3-5, 3-7, 3-9, and 3-11 penetrate portions of the insulating members 40 to which the conductive resin members 60 are fitted, and each base portion 71 is supported at the penetrated portion. The conductive resin members 60 are in contact with the contacts 7 (G) and are not in contact with the contacts 7 (N) and the contacts 7 (P).

As shown in FIG. 7B, the base portions 71 of the contacts 7 (N) of the second row, the contacts 7(P) of the third row, the contacts 7 (N) of the eighth row, the contacts 7 (P) of the ninth row, the contacts 7 (N) of the fourteenth row, the contacts 7 (P) of the fifteenth row, the contacts 7 (N) of the twentieth row, and the contacts 7 (P) of the twenty-first row of the assembly bodies 3-2, 3-4, 3-6, 3-8, and 3-10 penetrate portions of the insulating members 50 to which the conductive resin members 60 are not fitted, and each base portion 71 is supported at the penetrated portion.

Further, the contacts 7 (G) of the first row, the fourth row to the seventh row, the tenth row to the thirteenth row, the sixteenth row to the nineteenth row, and the twenty-second row of the assembly bodies 3-2, 3-4, 3-6, 3-8, and 3-10 penetrate portions of the insulating members 50 to which the conductive resin members 60 are fitted, and each base portion 71 is supported at the penetrated portion. The conductive resin members 60 are in contact with the contacts 7 (G) and are not in contact with the contacts 7 (N) and the contacts 7 (P).

As shown in FIG. 7C, the base portions 71 of the contacts 7 (S) of the fifth row, the contacts 7 (S) of the sixth row, the contacts 7 (S) of the eleventh row, the contacts 7 (S) of the twelfth row, the contacts 7 (N) of the seventeenth row, and the contacts 7 (P) of the eighteenth row of the assembly bodies 3-12 and 3-13 penetrate portions of the insulating members 40 to which the insulating supplemental members 69 are not fitted, and each base portion 71 is supported at the penetrated portion.

The contacts 7 (G) of the first row to the fourth row, the seventh row to the tenth row, the thirteenth row to the sixteenth row, and the nineteenth row to the twenty-second row of the assembly bodies 3-12 and 3-13 penetrate portions of the insulating members 40 to which the insulating supplemental members 69 are fitted, and each base portion 71 is supported at the penetrated portion.

As shown in FIG. 7A and FIG. 7B, the convex portions 612 of the conductive resin members 60 are on the −Y-side of the contacts 7 (S) of the first row, the fourth row, the seventh row, the tenth row, the thirteenth row, and the sixteenth row. Further, as shown in FIG. 8, the rear surface of the conductive resin member 60 on the front side of the column direction is abutted to the convex portion 612 of the conductive resin member 60 on the rear side of the column direction. Therefore, a plurality of conductive resin members 60 in contact with a plurality of contacts for ground 7 (G) surrounding the respective pairs of contacts 7 (N) and contact 7 (P) are in contact with each other, and these plurality of conductive resin members 60 are conducted.

Here, in the assembly process of the socket 1, the assembly bodies 3-j may be pressed into the housing 10 successively from the thirteenth column. Specifically, as shown in FIG. 10A, both ends of the assembly body 3-13 with an anchor 17 fixed to the contacts 7 are pressed into grooves 19-13 of the thirteenth column of the housing 10. Next, as shown in FIG. 10B, the anchor 17 of the assembly body 3-13 is bent and removed, and the remainder is reused as the assembly body 3-13 of the thirteenth column.

In the same way, the assembly bodies 3-12, 3-11, 3-10, 3-9, 3-8, 3-7, 3-6, 3-5, 3-4, 3-3, and 3-2 of the twelfth column, the eleventh column, the tenth column, the ninth column, the eighth column, the seventh column, the sixth column, the fifth column, the fourth column, the third column, the second column are pressed into the housing 10. Finally, as shown in FIG. 10C, both ends of the assembly body 3-1 with the anchor 17 fixed to the contacts 7 are pressed into the grooves 19-1 of the first column, the anchor 17 of the assembly body 3-1 is bent and removed, and the remainder is reused as the assembly body 3-1 of the first column.

Figure 6B:
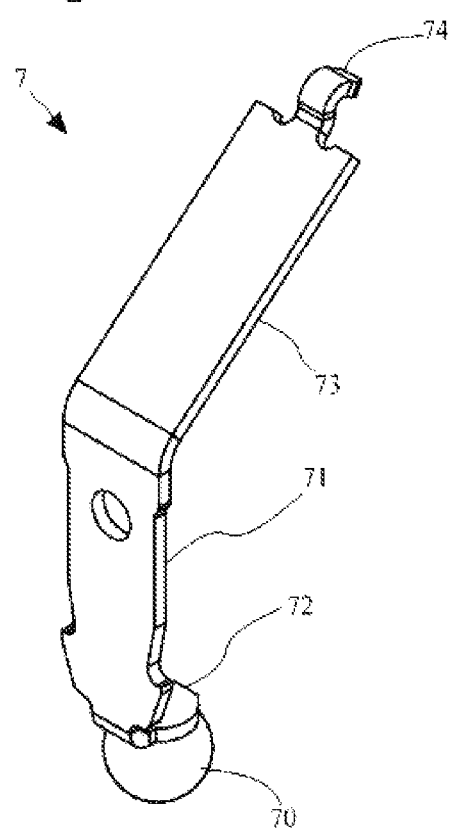
FIG. 6B is a perspective view of the contact of FIG. 7A to which a solder ball is mounted.

As shown in FIG. 6B, the solder ball 70 is fixed to the solder connecting portion 72 of the contact 7. As shown in FIG. 3B, the contacts 7 pass through the penetration holes 17-i-j of the bottom portion 13 of the housing 10 and extend downward, and the solder connecting portions 72 and the solder balls 70 of the contacts 7 are exposed on the lower side of the lower surface of the bottom portion 13.

As shown in FIG. 1, the cap 8 is in an approximately rectangular parallelepiped shape. Levers 83 are provided in the center of the Y-direction on the surfaces of the ±X-sides of the cap 8. A rectangular parallelepiped convex portion 830 is provided on the upper side of the center of the outer surface of the lever 83. Further, substantially triangular prism-shaped protruding pieces 831 are provided at positions apart from each other on the +Y-side and the −Y-side on the outer surface of the lever 83.

The end portions on the outer side of the convex portions 830 and the protruding pieces 831 protrude to an outer side than the surfaces of the cap 8 on the ±X-sides. Further, positioning grooves (not shown) are provided at a position near to the +X-side of one corner of the lower surface of the cap 8, and respective positions away from this position on the +X-side and the +Y-side.

When the cap 8 is fitted and pressed down between the protruding portions 23 on the −X-side and the protruding portions 23 on the +X-side from the above of the opening 110 of the socket 1, the protruding portions 23 push the protruding pieces 831 while sliding on the tapered surfaces 832 of the protruding pieces 831, and the levers 83 is tilted inward while crushing the gaps 835 on the inner side thereof.

When the cap 8 is further pressed down, the protruding pieces 831 of the cap 8 are fitted to the support holes 230 of the socket 1, the levers 83 return to the original positions by their own restoring force, three positioning pins 237 of the socket 1 are fitted to the three positioning grooves of the cap 8, and the cap 8 is supported by the holders 20 of the socket 1. Thereby, the cap 8 is mounted on the socket 1. Further, the cap 8 can be removed from the socket 1 by tilting the levers 83 of the cap 8 inward, releasing the fitting of the protruding pieces 831 and the support holes 230, and lifting the levers 83 up.

Figure 11B:
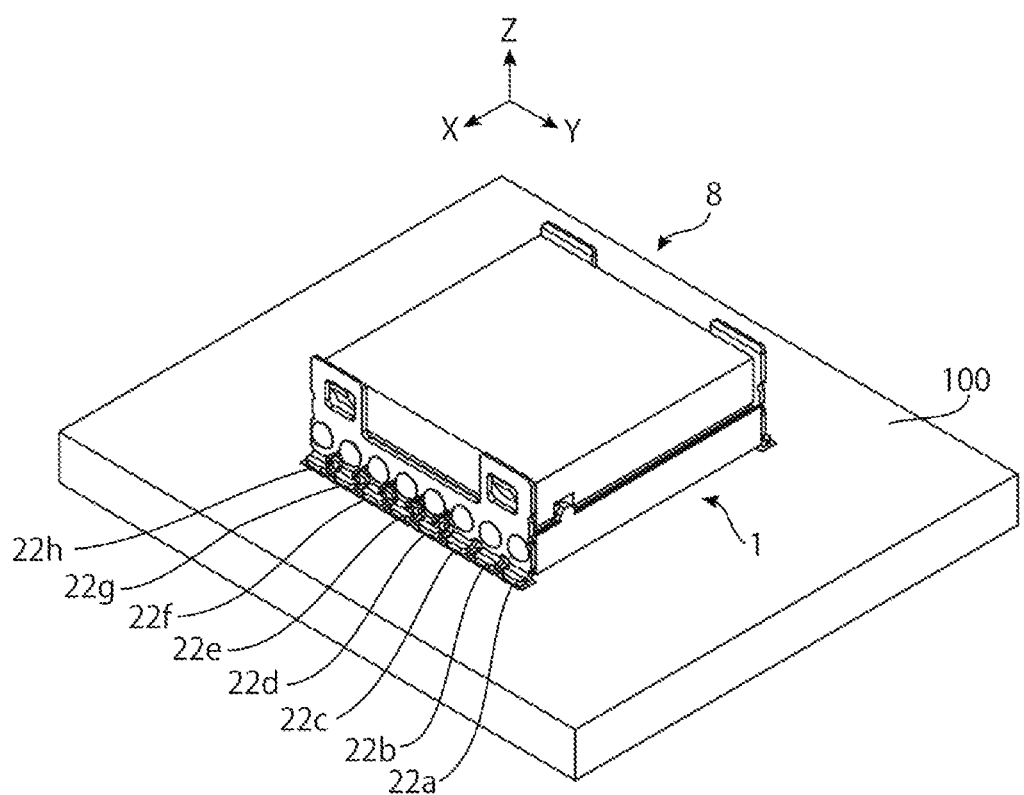

As shown in FIGS. 11A-11B, the socket 1 is placed on the circuit board 100 with the cap 8 mounted and reflow is performed. Lands for housing 122a, 122b, 122c, 122d, 122e, 122f, 122g, 122h for soldering the protruding portions 22a, 22b, 22c, 22d, 22e, 22f, 22g, 22h of the housing 10 may be provided on the circuit board 100, in addition to the land for contact 170 for soldering the contacts 7.

Figure 13:
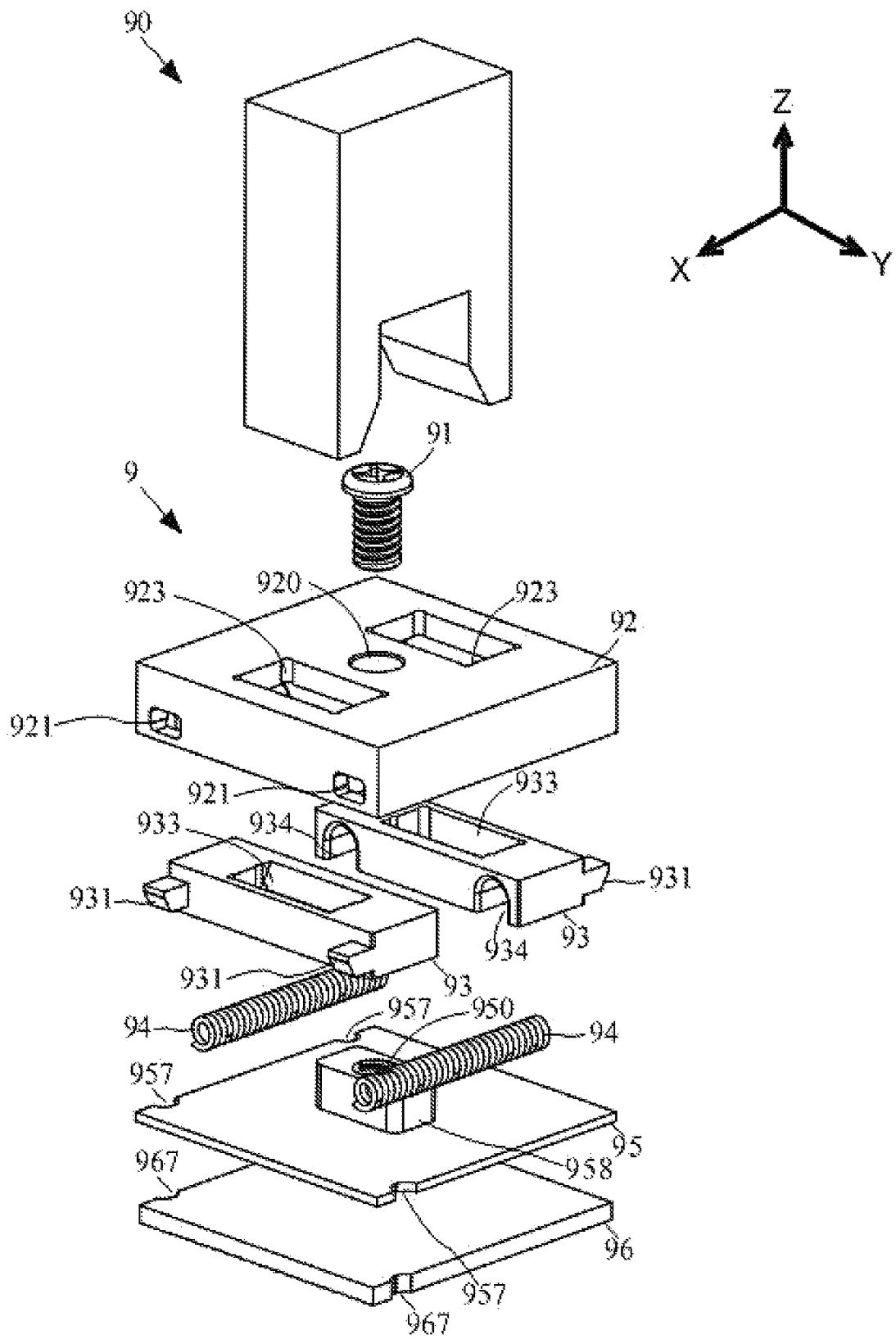
FIG. 13 is an exploded perspective view of the IC package and the remover of FIG. 12A.
Figure 14A:
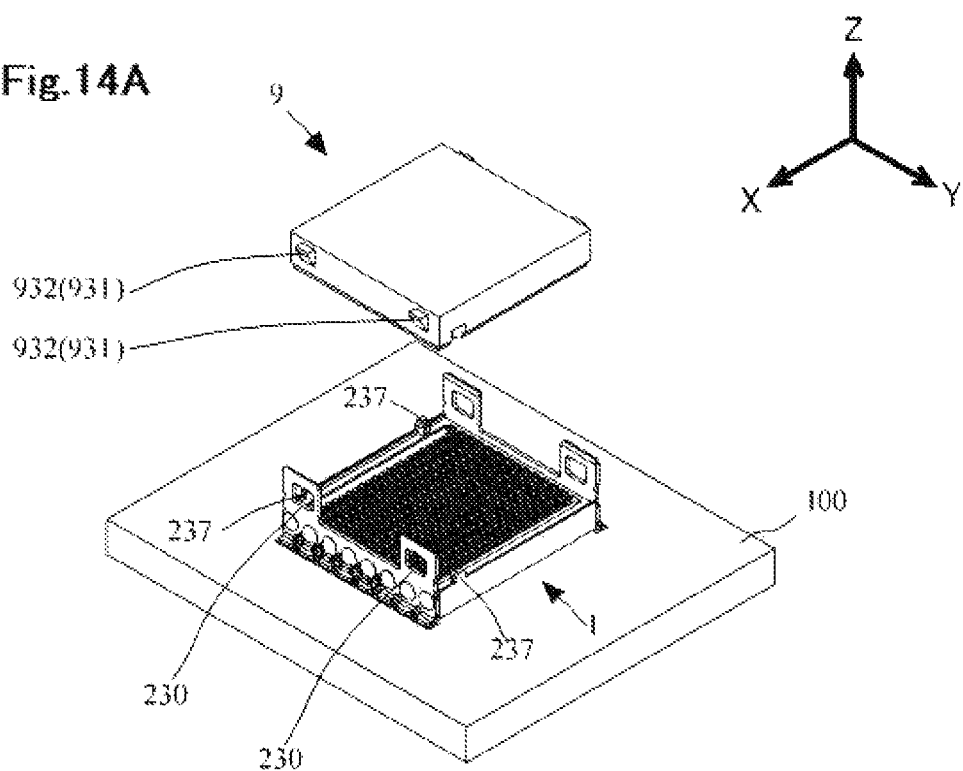
FIGS. 14 A and 14B illustrate a diagram showing an appearance of fitting the IC package to the socket on the circuit board of FIG. 11B.
Figure 14B:
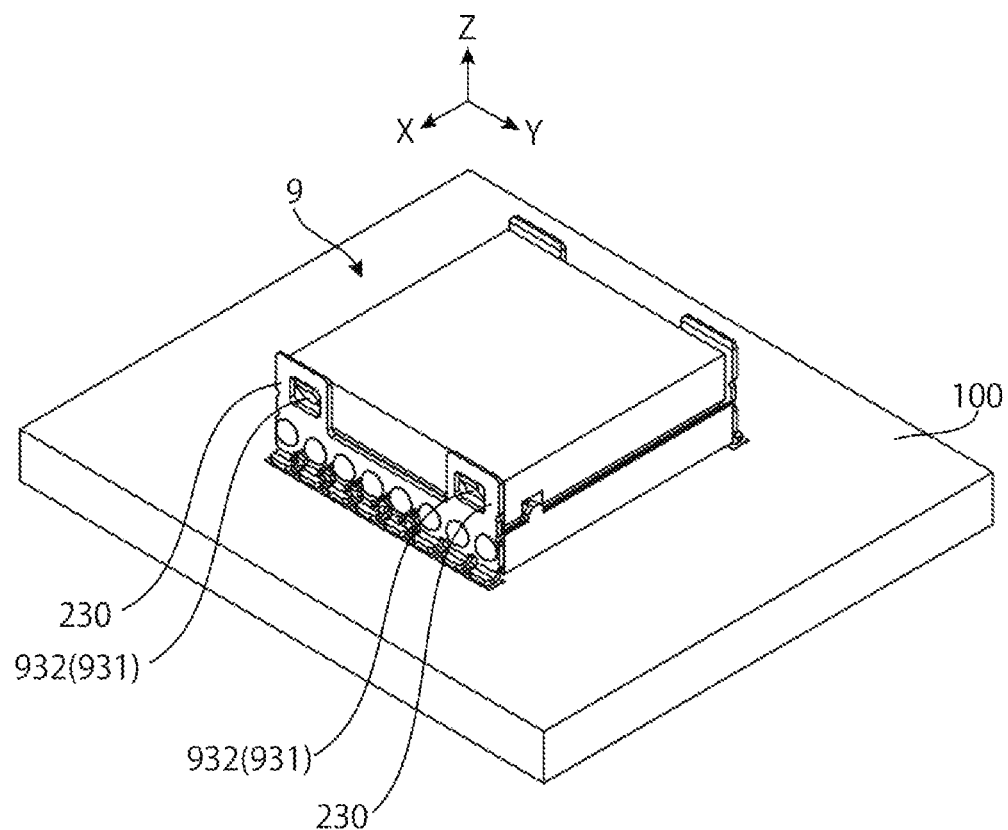

As shown in FIG. 12A and FIG. 12B, the IC package 9 is in an approximately rectangular parallelepiped shape with the same dimensions as the cap 8. As shown in FIG. 13, the IC package 9 has a screw 91, a first mechanical plate 92, two lock plates 93, two coil springs 94, a second mechanical plate 95, and a printed board 96. The first mechanical plate 92 serves as a casing to hold the lock plates 93, the coil springs 94, the second mechanical plate 95, and the printed board 96.

The first mechanical plate 92 is in a box shape opened on the lower side. A round hole 920 is provided in the center of the upper board of the first mechanical plate 92, and rectangular holes 923 are provided on the +X-side and the −X-side of the round hole 920. Rectangular holes 921 are provided at respective positions apart from each other on the +Y-side and the −Y-side in each of the side boards on the +X-side and the −X-side of the first mechanical plate 92.

A rectangular hole 933 is provided in the center of the lock plate 93 on the +X-side. The inner wall surface on the −X-side of the rectangular hole 933 of the lock plate 93 on the +X-side is inclined to the +X-side with respect to the Z-direction. Substantially triangular prism-shaped protruding pieces 931 are provided at positions apart from each other on the +Y-side and the −Y-side on the outer surface of the +X-side of the lock plate 93 on the +X-side. Upwardly recessed grooves 934 are provided at respective positions apart from each on the +Y-side and the −Y-side in the lower surface of the lock plate 93 on the +X-side. The +X-side of the groove 934 is open and the −X-side is blocked. The lock plate 93 on the −X-side has a mirror-symmetrical structure with the lock plate 93 on the +X-side.

A screw pedestal 958 is provided in the center of the second mechanical plate 95. A screw hole 950 is provided in the screw pedestal 958. Positioning grooves 957 are provided at a position near to the +X-side of one corner of the second mechanical plate 95, and positions away from this position on the +X-side and the +Y-side. Positioning grooves 967 are provided at a position near to the +X-side of one corner of the printed board 96, and positions away from this position on the +X-side and the +Y-side.

The second mechanical plate 95 and the printed board 96 are bonded so that the positioning grooves 957 and the positioning grooves 967 are aligned. Two lock plates 93 on the +X-side and the −X-side and the coil springs 94 accommodated in the grooves 934 thereof are placed around the screw pedestal 958 on the second mechanical plate 95, and these members are covered by the first mechanical plate 92.

The rectangular hole 933 of the lock plate 93 locates on the lower side of the rectangular hole 923 of the first mechanical plate 92. The screw 91 passes through the round hole 920 of the lock plate 93 and is screwed into the screw hole 950 of the second mechanical plate 95. An outward urging force is applied to the lock plate 93 on the +X-side and the lock plate 93 on the −X-side by the coil springs 94, which are elastic bodies, in the grooves 934 of both lock plates.

The outer surface of the lock plate 93 on the +X-side abuts the inner surface of the side board on the +X-side of the first mechanical plate 92. The protruding piece 931 of the lock plate 93 on the +X-side is supported movably forward and backward at the rectangular hole 921 of the side board on the +X-side of the first mechanical plate 92. This protruding piece 931 protrudes to the +X-side from the rectangular hole 921.

The outer surface of the lock plate 93 on the −X-side abuts the inner surface of the side board on the −X-side of the first mechanical plate 92. The protruding piece 931 of the lock plate 93 on the −X-side is supported movably forward and backward at the rectangular hole 921 of the side board on the −X-side of the first mechanical plate 92. This protruding piece 931 protrudes to the −X-side from the rectangular hole 921.

Figure 15A:
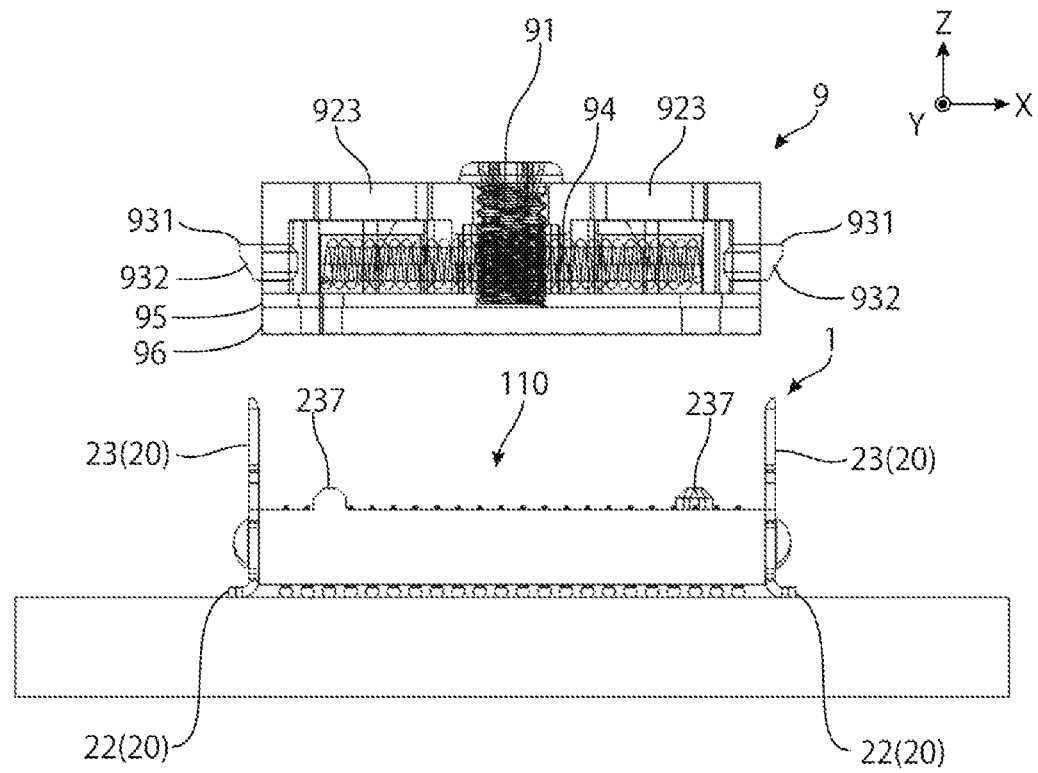
FIGS. 15A and 15B illustrate a diagram showing the shrinkage of the coil spring when the IC package of FIG. 13A is fitted to the socket.
Figure 15B:
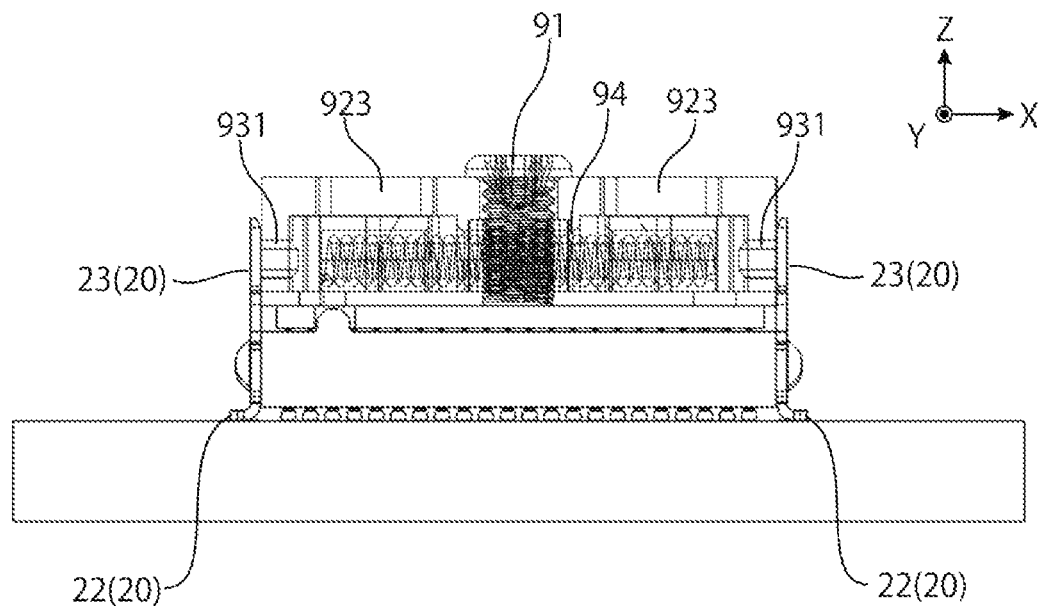

As shown in FIGS. 15A-15B, when the IC package 9 is fitted and pressed down between the protruding portion 23 on the −X-side and the protruding portion 23 on the +X-side from the above of the opening 110 of the socket 1, the protruding portions 23 push the protruding pieces 931 while sliding on the tapered surfaces 932 of the protruding pieces 931 of the IC package 9, and the protruding pieces 931 evacuate inward against the urging force of the coil spring 94.

When the IC package 9 is further pressed down, the protruding pieces 931 of the IC package 9 are fitted to the support holes 230 of the socket 1, three positioning pins 237 of the socket 1 are fitted to the three positioning grooves 957 and 967 of the IC package 9, and the IC package 9 is supported by the holders 20 of the socket 1. Thereby, mounting the IC package 9 onto the socket 1 is completed.

Figure 16A:
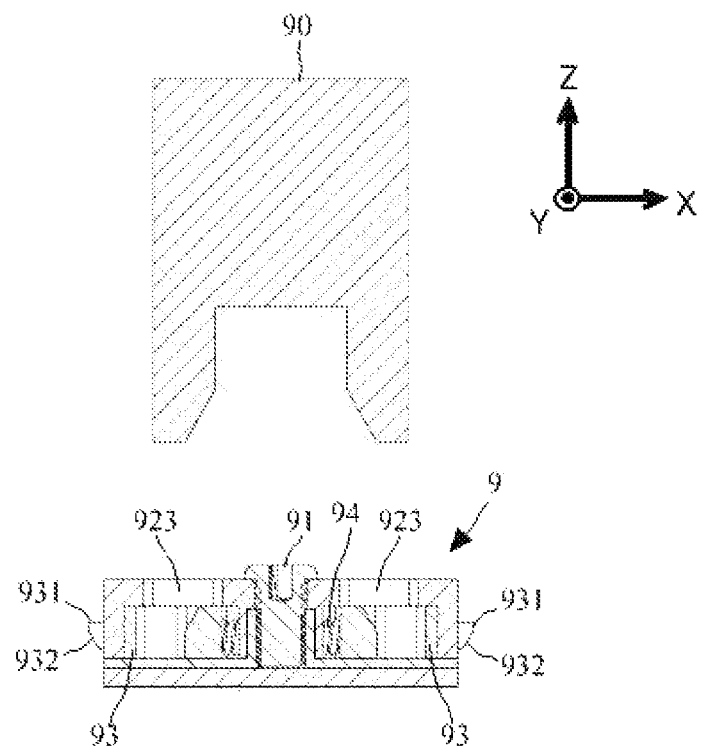
FIGS. 16A and 16B illustrate a diagram showing the shrinkage of the coil spring when the IC package of FIG. 13A is removed from the socket.
Figure 16B:
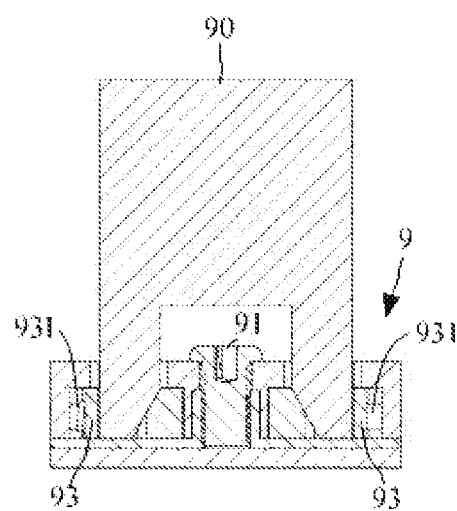

As shown in FIGS. 16A-16B, when a portion of the remover 90 branched into two is fitted and pressed down to the rectangular holes 933 of the lock plates 93 of the IC package 9, it pushes the lock plates 93 while sliding on the inner wall surfaces of the rectangular holes 933 of the lock plates 93 of the remover 90, and the lock plates 93 evacuate inward against the urging force of the coil spring 94. In this state, the IC package 9 can be removed from the socket 1 by lifting the IC package 9.

The above is the details of the present embodiment. The socket 1 according to the present embodiment includes: a housing 10 in a box shape with an opening 110 and being provided with a matrix of penetration holes 17-$i$ (i=1 to 22)-$j$ (j=1 to 13) at a bottom portion 13; a plurality of contacts 7 including respective pairs of contacts 7(N) and 7 (P) for high-speed differential transmission and contacts for ground 7(G); a plurality of insulating members 40, 50 supporting a plurality of contacts 7 and being pressed into the housing 10 so that the contacts 7 are exposed on the opposite side of the opening 110 from the penetration holes 17-$i$ (i=1 to 22)-$j$ (j=1 to 13) of the housing 10; and a plurality of conductive resin members 60 fitted to positions of a plurality of insulating members 40, 50 in contact with the contacts for ground 7(G). And the respective pairs of the contacts 7 (N) and 7 (P) for high-speed differential transmission are arranged apart from each other in the row direction and the column direction of the matrix. The contacts for ground 7 (G) are arranged at the adjacent positions in the row direction and the adjacent positions in the column direction in each of the respective pairs of the contacts 7 (N) and 7 (P) for high-speed differential transmission to surround the pair. Thus, the occurrence of crosstalk of high-speed differential transmission by the contacts 7 (N) and contact 7 (P) can be more reliably prevented.

Further, the socket 1 according to the present embodiment includes: a bottom portion 13 which forms the bottom of the opening 110 accommodating the IC package 9 and is provided with a plurality of penetration holes 17-$i$ (i=1 to 22)-$j$ (j=1 to 13); a housing 10 having two pairs of side wall portions 11, 12 facing each other across the opening 110, wherein a plurality of ribs 120$a$, 120$b$, 120$c$, 120$d$, 120$e$, 120$f$, 120$g$, 120$h$ protruding outward are provided on one pair of side wall portions 12; a plurality of contacts 7 supported by the housing 10 in such a way that these contacts 7 pass through a plurality of penetration holes 17-$i$ (i=1 to 22)-$j$ (j=1 to 13) and are exposed on the opposite side of the opening 110; and holders 20 with a plurality of support holes, wherein ribs 120$a$, 120$b$, 120$c$, 120$d$, 120$e$, 120$f$, 120$g$, 120$h$ pass through the support holes, and the holders 20 fixed to the side surfaces of the housing 10. Then, a portion of the lower end of the holder 20 extends downward lower than the lower end of the housing 10 and is bent outward. This bent portion forms a mounting surface to be soldered to the circuit board 100. Thus, even if the solder is melt due to reflow, the socket 1 is held on the circuit board 100 by the lower end portion of the holder 20, so that the solder does no move up and down and the contact 7 does not sink. Therefore, a socket 1 with high positioning accuracy of the contacts 7 can be provided.

Although the embodiment of the present disclosure has been described above, the following modifications may be added to the embodiment.

Figure 17:
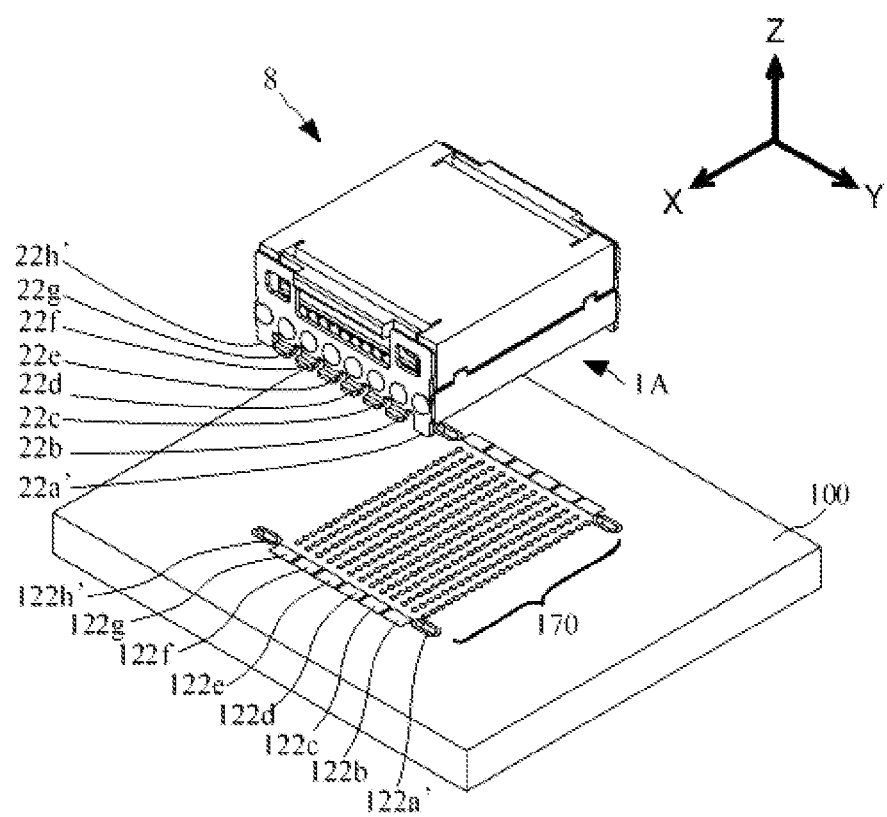
FIG. 17 is a diagram showing an appearance of mounting the socket 1A and the cap to the circuit board according to a modified example of the present disclosure.
Figure 18A:
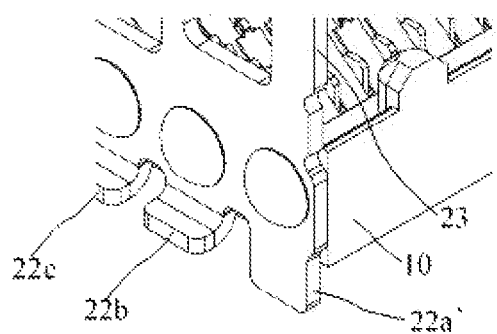
FIG. 18A is an enlarged view of a portion of the socket 1A of FIG. 17.
Figure 18B:
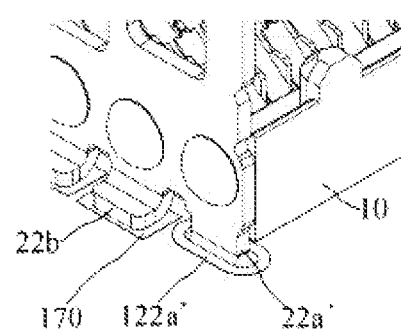
FIG. 18B is a diagram showing a joining portion of the socket 1A and the circuit board 100.
Figure 18C:
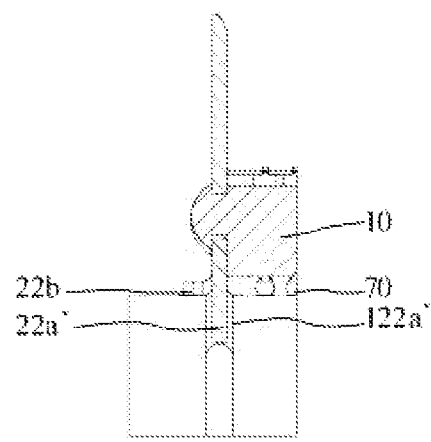
FIG. 18C is a diagram showing a joining portion of the socket 1A and the circuit board 100.

(1) In the above embodiment, eight protruding portions 22$a$, 22$b$, 22$c$, 22$d$, 22$e$, 22$f$, 22$g$, 22$g$ directly below five support holes at the lower end of the holder 20 extend downward and are bent outward on the lower side of the lower surface of the housing 10, and the lower surface of this portion formed a mounting surface. However, as shown in FIG. 17, FIG. 18A, among the eight protruding portions, two protruding portions 22$a$ and 22$h$ at both ends in the Y direction may go straight downward without being bent outward in the X direction, and these protruding portions 22$a$ and 22$h$ may be inserted and soldered into through holes 122$a$ and 12$h$ of the circuit board 100. As shown in FIG. 17B and FIG. 17C, according to this modified example, due to reflow, the melt solder enters the through holes 122$a$ and 122$h$, and contacts the protruding portions 22$a$ and 22$h$ and solidified, so that the joining strength between the socket 1 and the circuit board 100 becomes stronger, and the positioning accuracy of the contact 7 becomes higher.

Figure 19:
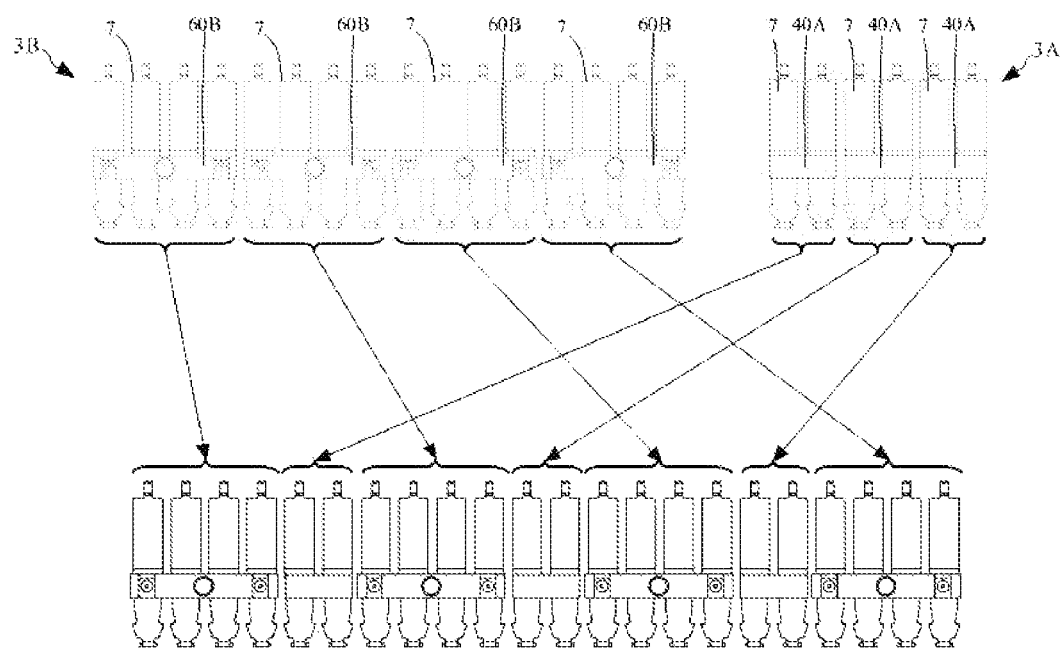
FIG. 19 is a diagram showing an assembly body 3A and an assembly body 3B according to a modification example of the present disclosure.

(2) In the above embodiment, the insulating members 40, 50 and the conductive resin members 60 are formed by insertion molding into sixteen contacts 7 forming each column to obtain assembly bodies 3-$j$ ($j$=1 to 13), and these assembly bodies 3-$j$ ($j$=1 to 13) are pressed into the grooves 19-$j$ ($j$=1 to 13) of the housing 10. However, as shown in FIG. 19, the assembly bodies 3A in which the insulating members 40A are formed by insertion molding in the contacts 7 (N) and the contacts 7(P), and the assembly bodies 3B in which the conductive resin members 60B are formed by insertion molding into the contacts 7(S) may be individually generated, and the assembly bodies 3A and the assembly bodies 3B may be alternatively arranged in the row direction.

In this case, the insulating members 40A of the assembly bodies 3A may be in a rectangular parallelepiped shape with a width of two contacts in the X direction, and the base portions 71 of the contacts 7 (N) and the contacts 7 (P) forming pairs of high-speed differential transmission may penetrate the insulating members 40A and be supported by the insulating members 40A. Further, the conductive resin members 60B of the assembly bodies 3B may be in a U-shape with a width of four contacts in the X direction, and the base portions 71 of the contacts 7 (S) may penetrate the conductive resin members 60B and be supported by the conductive resin members 60B. Further, the arrangement of the assembly bodies 3A and the assembly bodies 3B in the column direction may be lined up in such a way that the assembly bodies 3B are respectively positioned at adjacent positions in the row direction and adjacent positions in the column direction of the assembly bodies 3A to surround the assembly bodies 3A. According to this modified example, since the required number of insertion molding for obtaining the assembly bodies 3A and 3B is only one time, the manufacturing cost of socket 1 may be reduced.

Figure 20A:
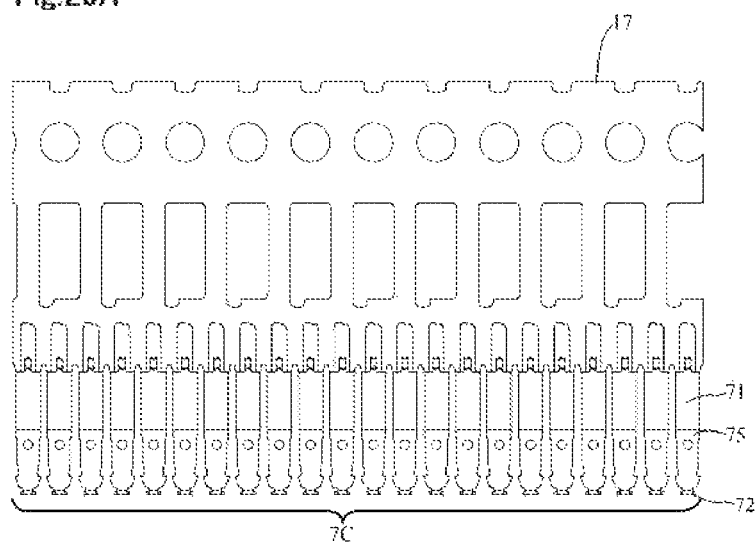
FIG. 20A is a front view of contacts 7C and an anchor to which the contacts 7C are fixed.
Figure 20B:
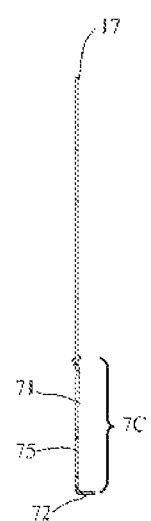
FIG. 20B is a side view of FIG. 20A.

(3) In the assembly process of the socket 1 according to the above embodiment, the insulating members 40, 50 and the conductive resin members 60 are formed by insertion molding into the contacts 7 as the assembly bodies 3-$j$ ($j$=1 to 13), and the assembly bodies 3-$j$ ($j$=1 to 13) are pressed into the grooves 19-$j$ of the housing 10 successively from the thirteenth column. However, support members combining the insulating members 40, 50 and the conductive resin members 60 may be pressed into the grooves 19-$j$ of the contacts 7, and then the contacts 7 may be pressed into the support holes of these support members. In this case, as shown in FIG. 20A and FIG. 20B, the contact 7C may have a base portion 71 extending in a straight line and being provided with a notch 75 in the middle, and a solder connecting portion 72 bent in an L-shape at the lower end of this base portion 71. The contacts 7C may be pressed into the housing 10 or the support member pressed in the housing 10 while being fixed to the anchor 17, and after pressing, the anchor 17 of the contacts 7C may be folded, and the portions of the contacts 7C above the notches 75 may be bent with the notches 75 as the ridgelines.

Figure 21A:
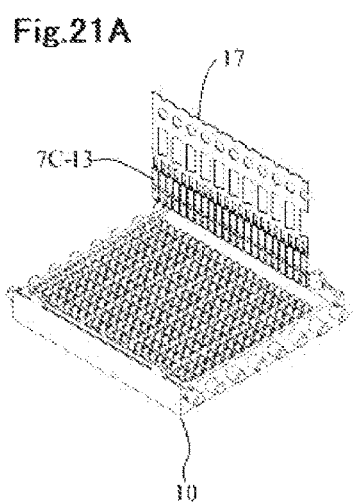
FIGS. 21A, 21B, 21C and 21D illustrate a diagram showing procedures of mounting the contacts of FIG. 19 to the housing.
Figure 21B:
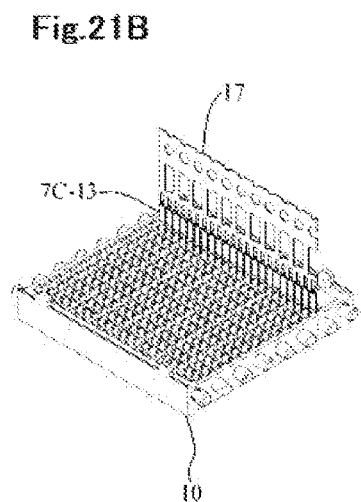
Figure 21C:
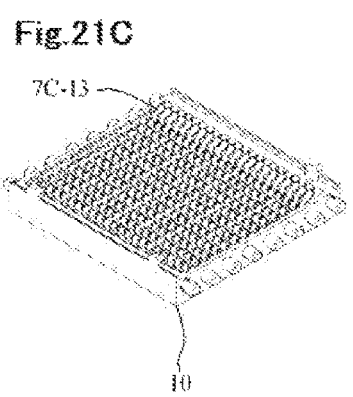
Figure 21D:
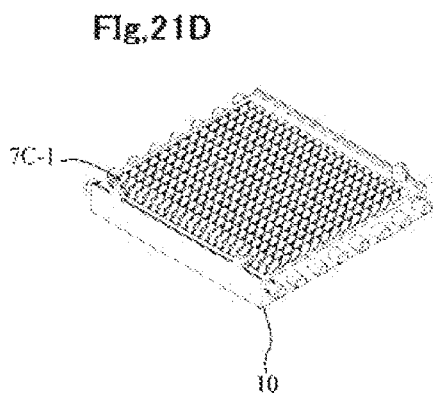

The procedure of the assembly process of the socket 1 according this modified example is as follows. First, as shown in FIG. 21A and FIG. 21B, the contacts 7C to which the anchor 17 is fixed are pressed into the penetration holes 17-$i$ ($i$=1 to 22)-8 of the thirteenth column of the housing 10, and the anchor 17 is folded and removed. Next, as shown in FIG. 21C, a portion above the notch 75 in the contact 7C of the eighth column is bent with the notch 75 as a ridgeline. The above process is performed for all rows of the penetration holes. That is, in the same manner as the thirteenth column, the contacts 7C are pressed into the penetration holes 17-$i$ ($i$=1 to 22)-12, 17-$i$ ($i$=1 to 22)-11, 17-$i$ ($i$=1 to 22)-10, 17-$i$ ($i$=1 to 22)-9, 17-$i$ ($i$=1 to 22)-8, 17-$i$ ($i$=1 to 22)-7, 17-$i$ ($i$=1 to 22)-6, 17-$i$ ($i$=1 to 22)-5, 17-$i$ ($i$=1 to 22)-4, 17-$i$ ($i$=1 to 22)-3, 17-$i$ ($i$=1 to 22)-2 of the twelfth column, the eleventh column, the tenth column, the ninth column, the eighth column, the seventh column, the sixth column, the fifth column, the fourth column, the third column, and the second column, the anchors 17 are folded and removed, and the portions above the notches 75 are bent. Finally, as shown in FIG. 21D, the contacts 7C are pressed into the penetration holes 17-$i$ ($i$=1 to 22)-1 of the first column, the anchor 17 is folded and removed, and the portions above the notches 75 are bent.

What is claimed is:

1. A socket which holds an IC package and is to be mounted on a circuit board, comprising:
    a housing with a bottom portion, two pairs of side wall portions and an opening accommodating an IC package, the bottom portion being a bottom of the opening and provided with a plurality of penetration holes, the two pairs of side wall portions face each other across the opening therebetween, and one pair of side wall portions being provided with a plurality of ribs protruding outward;
    a plurality of contacts supported by the housing so as to pass through the plurality of penetration holes and be exposed on an opposite side of the opening; and
    holders that comprise a plurality of first support holes and are fixed to side surfaces of the housing with the plurality of ribs passing through the first support holes, respectively, wherein at least a portion of a lower end of the holder extends downward below a lower end of the housing and is bent outward, and the bent portion forms a mounting surface to be soldered to the circuit board.

2. The socket according to claim 1, wherein the IC package comprises a casing in a box shape and protruding pieces supported movably forward and backward by two side boards of the casing, an upper end of the holder extends upward above an upper end of the housing, a second support hole is provided at the extending portion, and the IC package is supported by the holder by fitting the protruding piece to the second support hole.

3. The socket according to claim 1, wherein the rib is fused into the first support hole.

4. The socket according to claim 1, wherein two positioning pins are provided at one side wall portion of one pair of side wall portions, and one positioning pin is provided at the other side wall portion, positioning grooves are provided at positions corresponding to the positioning pins on a lower surface of the casing of the IC package, and the positioning pins are fitted to the positioning grooves.

5. The socket according to claim 1, wherein portions at both ends in a direction orthogonal to the opposite direction at the lower end of the holder go straight downward without being bent to the outer side of the opposite direction, and the portions going straight are inserted and soldered into through holes of the circuit board.

6. The socket according to claim 1, further comprising insulating members supporting the contacts and being pressed into the housing in such a manner that the contacts are exposed on an opposite side of the opening from the penetration holes of the housing;
  wherein the contact comprises a base portion extending in a straight line, a solder connecting portion bent in an L-shape at one end of the base portion, and an inclined portion bent at an obtuse angle and extending obliquely with respect to the base portion at the other end of the base portion, and the contact and the insulating member are formed by insertion molding in such a manner that the base portion of the contact penetrates the insulating member and supported by the insulating member.

7. The socket according to claim 1, wherein the penetration holes are in a matrix shape,
  grooves are provided on an outer side of a column of the penetration holes at the other pair of side wall portions, and the conductive resin members are pressed into the grooves.

8. An IC package comprising:
  a printed board;
  a casing in a box shape that comprises two side boards and holds the printed board;
  protruding pieces supported movably forward and backward by the two side boards of the casing; and
  elastic members applying outward urging force to the protruding pieces;
  wherein when the IC package is fitted and pressed down between two holders of a connector from an opening of the connector, the protruding pieces are pushed by the holders and evacuate inward, and the IC package is further pressed down, the protruding piece are fitted to support holes of the holders, and the IC package is supported by the holders.

9. A method of mounting contacts to a housing of a connector, comprising performing for all columns of the penetration holes, the method comprising:
  pressing a plurality of contacts fixed to an anchor into a column of penetration holes of a connector, the plurality of contacts each comprising a linear portion extending in a straight line and being provided with a notch in the middle, the anchor being integrally fixed to upper ends of the linear portions and a connecting portion bent in an L-shape at a lower end of the linear portion;
  folding and removing the anchor of the plurality of contacts pressed into the column of penetration holes; and
  bending portions above the notches of the plurality of contacts from which the anchor has been removed using the notches as ridgelines.

* * * * *